(12) United States Patent
Aoyama et al.

(10) Patent No.: US 12,672,517 B2
(45) Date of Patent: Jun. 30, 2026

(54) METHOD FOR PRODUCING SEMICONDUCTOR DEVICE, AND EXPANDABLE TAPE

(71) Applicant: Resonac Corporation, Tokyo (JP)

(72) Inventors: Motoo Aoyama, Tokyo (JP); Masataka Nishida, Tokyo (JP)

( * ) Notice: Subject to any disclaimer, the term of this patent is extended or adjusted under 35 U.S.C. 154(b) by 77 days.

(21) Appl. No.: 18/859,993

(22) PCT Filed: Jul. 26, 2023

(86) PCT No.: PCT/JP2023/027426
§ 371 (c)(1),
(2) Date: Oct. 25, 2024

(87) PCT Pub. No.: WO2024/024852
PCT Pub. Date: Feb. 1, 2024

(65) Prior Publication Data
US 2025/0293074 A1    Sep. 18, 2025

(30) Foreign Application Priority Data
Jul. 29, 2022    (JP) ................................. 2022-121555

(51) Int. Cl.
*H10P 72/70*        (2026.01)
(52) U.S. Cl.
CPC ................................ *H10P 72/7402* (2026.01)
(58) Field of Classification Search
CPC ..... H10P 72/7402; H10P 72/742; H10P 95/00
USPC ....................................................... 156/229
See application file for complete search history.

(56) References Cited

U.S. PATENT DOCUMENTS 10,460,973 B2 * 10/2019 Tominaga ........... H10P 72/7402

FOREIGN PATENT DOCUMENTS

| JP | 2021-156787 | 10/2021 |
| WO | 2018/003312 | 1/2018 |
| WO | 2018/216621 | 11/2018 |

OTHER PUBLICATIONS

International Preliminary Report on Patentability with Written Opinion dated Feb. 13, 2025 for PCT/JP2023/027426.
International Search Report dated Oct. 10, 2023 for PCT/JP2023/027426.

* cited by examiner

*Primary Examiner* — James D Sells
(74) *Attorney, Agent, or Firm* — SHIPWAY IP

(57) ABSTRACT

A method for producing a semiconductor device includes: a step A of selecting an expandable tape including a base material film and a pressure-sensitive adhesive layer, the tape having a 90° peel strength of the layer to a stainless plate larger than a 180° peel strength; a step B of preparing a laminate including the tape and a plurality of semiconductor chips having first main surfaces; a step C of expanding intervals between the plurality of chips by stretching the tape while heating the tape; and a step D of transferring the plurality of chips onto a pressure-sensitive adhesive layer of another tape of a same type as the tape and peeling the tape at a peeling angle of more than 90° with respect to the first main surfaces of the plurality of chips. The step C and step D are repeated one or more times.

10 Claims, 5 Drawing Sheets

(a)

(b)

(c)

(a)

(b)

(c)

(a)

(b)

(c)

(d)

(a)

(b)

METHOD FOR PRODUCING SEMICONDUCTOR DEVICE, AND EXPANDABLE TAPE

CROSS-REFERENCE TO RELATED APPLICATIONS

This application is a 35 U.S.C. § 371 national phase application of PCT/JP2023/027426, filed on Jul. 26, 2023, which claims priority to Japanese Patent Application No. 2022-121555, filed on Jul. 29, 2022.

TECHNICAL FIELD

The present disclosure relates to a method for producing a semiconductor device and an expandable tape.

BACKGROUND ART

In recent years, with miniaturization, high functionality, and high integration of semiconductor devices, an increase in a number of pins, an increase in a density, and a decrease in a pitch of wirings of semiconductors have progressed. Therefore, a fragile layer such as a low-K layer for the purpose of miniaturizing pins or wirings or reducing permittivity is applied, and accordingly, a technique for achieving high reliability is required.

Under such circumstances, a wafer level package (WLP) technique capable of achieving high reliability, high production, and the like has been developed. The WLP technique is characterized in that assembly is performed in a wafer state and the wafer is singulated by dicing in a final step. Since the assembly (sealing) is collectively performed at a wafer level, the technique allows for high production and high reliability. In the WLP technique, a rewiring layer in which a rewiring pattern is formed of polyimide, copper wiring, or the like is formed on an insulating film on a circuit surface of a semiconductor chip, and a metal pad, a solder ball, or the like is mounted on the rewiring to form a connection terminal bump.

The WLP includes a semiconductor package having a package area similar to that of the semiconductor chip, such as a wafer level chip scale package (WLCSP) or a fan in wafer level package (FI-WLP), and a semiconductor package having a package area larger than that of the semiconductor chip, such as a fan out wafer level package (FO-WLP), and capable of expanding a terminal to an outside of the chip. In such a semiconductor package, miniaturization and thinning are rapidly progressing, and sealing is performed at the wafer level in order to secure reliability, and after a periphery of the semiconductor chip is protected, formation of the rewiring layer, singulation for each package, and the like are performed.

In such a semiconductor package, as described above, sealing is performed at a wafer level, and handling such as secondary mounting is performed thereafter, thereby securing reliability. In addition, in a field of mounting a single-function semiconductor such as a discrete semiconductor, sealing is also performed at a wafer level for the purpose of reducing crack of a semiconductor chip or stress applied to a pad peripheral portion at the time of handling. Next, after the periphery of the semiconductor chip is protected, singulation is performed for each package, and a next step (SMT process or the like) is performed. Many discrete semiconductors are smaller than a system LCI, and in order to provide a higher degree of protection for the semiconductor chip, there is a particular demand for implementing five-face or six-face sealing of the semiconductor chip.

In order to seal a side surface of such a semiconductor chip, it is necessary to widen intervals between the semiconductor chips after singulation of the wafer and fabrication of the semiconductor chips. For example, Patent Literature 1 discloses a method for fixing a plurality of chips on an expandable tape, stretching the expandable tape to widen intervals between semiconductor chips, and then peeling the expandable tape from the semiconductor chips, and an expandable tape that can be used in the method.

CITATION LIST

Patent Literature

Patent Literature 1: WO 2018/216621 A1

SUMMARY OF INVENTION

Technical Problem

In the case of widening the intervals between the semiconductor chips using the expandable tape, it is conceivable to repeat a tape expanding step and a transfer step one or more times so as to widen the intervals between the semiconductor chips, transfer the semiconductor chips to another expandable tape, and widen the intervals between the semiconductor chips using the another expandable tape, instead of widening the intervals between the semiconductor chips only once. At this time, when an expandable tape (another expandable tape) as a transfer destination is the same as an expandable tape as a transfer source, there is no difference in a stretching ratio at the time of widening, so that the intervals between the semiconductor chips can be efficiently widened. However, in transfer between expandable tapes having a same adhesive force, a transfer failure may occur in which the semiconductor chips are not transferred to the expandable tape as the transfer destination. When the transfer failure occurs, there is a concern about a decrease in productivity.

Therefore, a main object of the present disclosure is to provide a method for producing a semiconductor device capable of sufficiently suppressing a transfer failure at the time of transfer between same expandable tapes when a tape expanding step and a transfer step are repeated one or more times.

Solution to Problem

The present inventors have studied to solve the above problems, and found that it is possible to sufficiently suppress a transfer failure at the time of transfer between the same expandable tapes by peeling the expandable tape as the transfer source at a predetermined angle by using a predetermined expandable tape, thereby completing the invention of the present disclosure.

The present disclosure provides a method for producing a semiconductor device according to [1] or [2], and an expandable tape according to [3] or [4].

[1] A method for producing a semiconductor device having a semiconductor chip, the method including: a selection step of selecting an expandable tape including a base material film and a pressure-sensitive adhesive layer containing a non-ultraviolet curable pressure-sensitive adhesive provided on the base material film, in which a first adhesive force of the pressure-sensitive adhesive layer to a stainless plate measured under conditions of a peeling angle of 90° and a peeling rate of 300 mm/min at 25° C. is larger than a second adhesive force of the pressure-sensitive adhesive layer to the stainless plate measured under conditions of a peeling angle of 180° and a peeling rate of 300 mm/min at 25° C.; a preparation step of preparing a laminate including the expandable tape and a plurality of the semiconductor chips having first main surfaces and second main surfaces opposite to the first main surfaces, in which the plurality of semiconductor chips being fixed on the pressure-sensitive adhesive layer of the expandable tape on the first main surfaces; a tape expanding step of expanding intervals between the plurality of semiconductor chips fixed on the expandable tape by stretching the expandable tape while heating the expandable tape; and a transfer peeling step of transferring the plurality of semiconductor chips onto a pressure-sensitive adhesive layer of another expandable tape of a same type as the expandable tape so that the second main surfaces of the plurality of semiconductor chips are fixed, and peeling the expandable tape at a peeling angle of more than 90° with respect to the first main surfaces of the plurality of semiconductor chips, in which the tape expanding step and the transfer peeling step are repeated one or more times in this order.

[2] The method for producing a semiconductor device according to [1], in which the first adhesive force is 1.2 N/25 mm or more.

[3] An expandable tape including: a base material film; and a pressure-sensitive adhesive layer containing a non-ultraviolet curable pressure-sensitive adhesive provided on the base material film, in which a first adhesive force of the pressure-sensitive adhesive layer to a stainless plate measured at conditions of a peeling angle of 90° and a peeling rate of 300 mm/min at 25° C. is larger than a second adhesive force of the pressure-sensitive adhesive layer to the stainless plate measured at conditions of a peeling angle of 180° and a peeling rate of 300 mm/min at 25° C.

[4] The expandable tape according to [3], in which the first adhesive force is 1.2 N/25 mm or more.

The reason why the transfer failure at the time of transfer between the same expandable tapes can be sufficiently suppressed by peeling the expandable tape as the transfer source at the predetermined angle using the predetermined expandable tape is not necessarily clear, but the present inventors infer that this is because the first adhesive force of the expandable tape is larger than the second adhesive force, and an adhesive force between the expandable tape as the transfer destination and the semiconductor chips becomes larger than an adhesive force between the expandable tape as the transfer source and the semiconductor chips by peeling the expandable tape as the transfer source at the predetermined angle, so that the semiconductor chips are easily transferred to the expandable tape as the transfer destination.

Advantageous Effects of Invention

According to the present disclosure, there is provided a method for producing a semiconductor device capable of sufficiently suppressing a transfer failure at a time of transfer between same expandable tapes when a tape expanding step and a transfer step are repeated one or more times. Furthermore, according to the present disclosure, there is provided an expandable tape suitably used in such a method for producing a semiconductor device.

DESCRIPTION OF EMBODIMENTS

Figure 1:
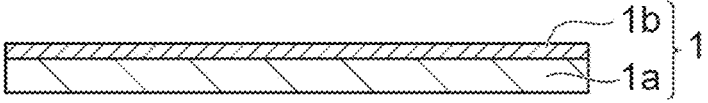
FIG. 1 is a schematic cross-sectional view illustrating an embodiment of an expandable tape.

Hereinafter, the present embodiment will be described in detail with reference to the drawings. However, the present disclosure is not limited to the following embodiment. In the following embodiment, the components (including steps and the like) are not essential unless otherwise specified. The same or corresponding portions are denoted by the same reference numerals, and redundant description will be omitted. Further, unless otherwise specified, a positional relationship such as up, down, left, and right is based on a positional relationship illustrated in the drawings. Sizes of the components in the drawings are conceptual, and a relative relationship between the sizes of the components is not limited to that illustrated in the drawings.

The same applies to numerical values and ranges thereof in the present disclosure, and the present disclosure is not limited thereto. In the present specification, a numerical range indicated using "to" indicates a range including numerical values described before and after "to" as a minimum value and a maximum value, respectively. In numerical ranges described in stages in the present specification, an upper limit value or a lower limit value described in one numerical range may be replaced with an upper limit value or a lower limit value of a numerical range described in another stage. In addition, in the numerical range described in the present specification, the upper limit value or the lower limit value of the numerical range may be replaced with a value shown in Examples.

In the present specification, the term "layer" also includes a structure having a shape partially formed in addition to a structure having a shape formed on the entire surface when observed as a plan view. In the present specification, the term "step" includes not only an independent step but also a step that cannot be clearly distinguished from other steps as long as an intended action of the step is achieved.

In the present specification, a (meth)acrylate means an acrylate or a methacrylate corresponding thereto. The same applies to other similar expressions such as a (meth)acrylic copolymer.

Components and materials exemplified in the present specification may be used singly or in combination of two or more kinds thereof unless otherwise specified.

Method for Producing Semiconductor Device

A method for producing a semiconductor device according to an embodiment relates to a method for producing a semiconductor device having semiconductor chips. The method for producing a semiconductor device includes a selection step, a preparation step, a tape expanding step, and a transfer peeling step.

In the method for producing a semiconductor device according to the present embodiment, after the tape expanding step using an expandable tape (expandable tape as a transfer source) and it is transferred to another expandable tape (expandable tape as a transfer destination) to be finally transferred to a carrier, the tape expanding step and the transfer step are repeated one or more times in this order using another expandable tape.

The method for producing a semiconductor device may further include, for example, the following steps.

A tension holding step of holding a tension of stretched expandable tape.

A carrier transfer step of transferring a plurality of semiconductor chips to a carrier FIG. 1 is a schematic cross-sectional view illustrating an embodiment of an expandable tape. FIGS. 2, 3, 4, and 5 are schematic cross-sectional views for explaining the embodiment of the method for producing a semiconductor device.

Selection Step

In a selection step, an expandable tape satisfying a predetermined condition is selected from expandable tapes. An expandable tape 1 illustrated in FIG. 1 includes a base material film 1a and a pressure-sensitive adhesive layer 1b containing a non-ultraviolet curable pressure-sensitive adhesive provided on the base material film 1a. Hereinafter, a configuration of the expandable tape will be described.

Examples of the base material film 1a include a polyester-based film such as a polyethylene terephthalate film; a polyolefin-based film such as a polytetrafluoroethylene film, a polyethylene film, a polypropylene film, a polymethylpentene film, a polyvinyl acetate film, a homopolymer of α-olefin such as poly-4-methylpentene-1 and a copolymer thereof, and an ionomer of these homopolymers or copolymers; a polyvinyl chloride film; a polyimide film; and various plastic films such as a urethane resin film. The base material film 1a is not limited to a single-layer film, and may be a multi-layer film obtained by combining two or more plastic films or a multi-layer film obtained by combining two or more plastic films of the same type.

The base material film 1a may be a polyolefin-based film or a urethane resin film from the viewpoint of tensile stress and stretchability. The base material film 1a may include various additives such as an antiblocking agent as necessary.

A thickness of the base material film 1a may be 50 to 500 μm, 60 to 400 μm, or 70 to 300 μm. When the thickness of the base material film 1a is 50 μm or more, stretchability tends to be improved. When the thickness of the base material film 1a is 500 μm or less, defects such as easy occurrence of distortion and deterioration in handleability tend to be suppressed.

When the base material film is a multi-layer film, it is preferable to adjust the thickness of the entire base material film to be within the above range. The base material film may be subjected to chemical or physical surface treatment as necessary in order to improve adhesion to the pressure-sensitive adhesive layer. Examples of the surface treatment include corona treatment, chromic acid treatment, ozone exposure, flame exposure, high-pressure electric shock exposure, and ionizing radiation treatment.

The pressure-sensitive adhesive layer 1b includes a non-ultraviolet curable pressure-sensitive adhesive. The non-ultraviolet curable pressure-sensitive adhesive is a type of pressure sensitive adhesive that exhibits constant tackiness when pressurized for a short time, and is an adhesive whose tackiness does not greatly vary before and after irradiation with ultraviolet rays. As the non-ultraviolet curable pressure-sensitive adhesive, a conventionally known adhesive can be used without particular limitation as long as it is an adhesive capable of forming a pressure-sensitive adhesive layer having a first adhesive force larger than a second adhesive force. Examples of the non-ultraviolet curable pressure-sensitive adhesive include natural rubber-based, synthetic rubber-based, acrylic resin-based, polyvinyl ether resin-based, urethane resin-based, and silicone resin-based adhesives.

A thickness of the pressure-sensitive adhesive layer 1b may be usually 1 to 100 μm, 2 to 50 μm, or 5 to 40 μm. When the thickness of the pressure-sensitive adhesive layer 1b is 1 μm or more, sufficient adhesive force with semiconductor chips 2 can be secured, so that scattering of the semiconductor chips can be more highly prevented during the tape expanding step. On the other hand, when the thickness of the pressure-sensitive adhesive layer 1b is 100 μm or less, it is economically advantageous.

The thickness of the pressure-sensitive adhesive layer 1b may be 10 μm or more, and may be 20 to 50 μm or 30 to 50 μm. When the thickness of the pressure-sensitive adhesive layer 1b is 10 μm or more, even when a semiconductor wafer is diced on the expandable tape 1 without using a dicing tape, damage (cut or the like) does not occur in the base material film 1a. Therefore, in the preparation step, a step of dicing the semiconductor wafer on the dicing tape and transferring (laminating) to the expandable tape 1 can be omitted.

The expandable tape 1 may be manufactured according to techniques well known in the art. For example, it can be manufactured according to the following method. First, a varnish including a component configuring the pressure-sensitive adhesive layer and a solvent is applied onto a protective film by a knife coating method, a roll coating method, a spray coating method, a gravure coating method, a bar coating method, a curtain coating method, or the like, and the solvent (organic solvent) is removed to form the pressure-sensitive adhesive layer. A condition for removing the solvent may be, for example, a heating condition of 50° C. to 200° C. for 0.1 to 90 minutes. The condition for removing the solvent may be a condition for removing the solvent until an amount of the solvent becomes 1.5 mass % or less as long as there is no influence on occurrence of voids or viscosity adjustment in each step. Subsequently, the fabricated protective film with the pressure-sensitive adhesive layer and the base material film 1a are laminated under a temperature condition of 25° C. to 60° C. so that the pressure-sensitive adhesive layer 1b and the base material film 1a face each other, whereby the expandable tape 1 can be obtained. When the expandable tape is used, it is usually used after the protective film is peeled off.

Examples of the protective film include A-63 (release treatment agent: modified silicone-based, manufactured by Toyobo Film Solutions Co., Ltd.) and A-31 (release treatment agent: Pt-based silicone-based, manufactured by Toyobo Film Solution Co., Ltd.).

A thickness of the protective film is appropriately selected within a range in which workability is not impaired. The thickness of the protective film may be 100 μm or less from the economic viewpoint. The thickness of the protective film may be 10 to 75 μm or 25 to 50 μm. When the thickness of the protective film is 10 μm or more, there is a tendency that defects such as breakage of the film at the time of fabricating the expandable tape hardly occur. When the thickness of the protective film is 75 μm or less, the protective film can be easily peeled off when the expandable tape is used.

In the selection step, in the expandable tape having such a configuration, a first adhesive force of the pressure-sensitive adhesive layer 1b to a stainless plate measured under conditions of a peeling angle of 90° and a peeling rate of 300 mm/min at 25° C. and a second adhesive force of the pressure-sensitive adhesive layer 1b to the stainless plate measured under conditions of a peeling angle of 180° and a peeling rate of 300 mm/min at 25° C. are measured, and an expandable tape in which the first adhesive force is larger than the second adhesive force is selected.

The first adhesive force of the pressure-sensitive adhesive layer 1b to the stainless plate is larger than the second adhesive force, and may be, for example, 1.2 N/25 mm or more. Here, the first adhesive force is a 90° peel strength measured under conditions of a peeling angle of 90° and a peeling rate of 300 mm/min at 25° C. The 90° peel strength can be measured, for example, by the following method. First, an expandable tape is cut out into a size of 25 mm in width×100 mm in length, and a surface on the side of the pressure-sensitive adhesive layer 1b is attached to a stainless plate (stainless support plate), and this is used as a measurement sample. Next, with the stainless plate (stainless support plate) side of the measurement sample fixed, the pressure-sensitive adhesive layer 1b is peeled off using a tensile tester (autograph AGS-1000, manufactured by Shimadzu Corporation) under conditions of a measurement temperature of 25° C., a peeling angle of 90°, and a peeling rate of 300 mm/min, whereby the 90° peel strength can be measured. The first adhesive force may be 1.3 N/25 mm or more or 1.5 N/25 mm or more. An upper limit of the first adhesive force may be, for example, 3.0 N/25 mm or less, 2.5 N/25 mm or less, or 2.0 N/25 mm or less.

The second adhesive force of the pressure-sensitive adhesive layer 1b to the stainless plate is smaller than the first adhesive force, and may be, for example, less than 1.2 N/25 mm. Here, the second adhesive force is a 180° peel strength measured under conditions of a peeling angle of 180° and a peeling rate of 300 mm/min at 25° C. The 180° peel strength can be measured in the same manner as in the measurement of the 90° peel strength except that the peeling angle of 90° is changed to the peeling angle of 180°. The second adhesive force may be 1.1 N/25 mm or less or 1.0 N/25 mm or less. A lower limit of the second adhesive force may be, for example, 0.1 N/25 mm or more, 0.3 N/25 mm or more, or 0.5 N/25 mm or more.

A difference between the first adhesive force and the second adhesive force may be, for example, 0.1 N/25 mm or more, 0.3 N/25 mm or more, or 0.5 N/25 mm or more. The difference between the first adhesive force and the second adhesive force may be, for example, 1.0 N/25 mm or less.

The first adhesive force may be, for example, 1.1 times or more, 1.3 times or more, or 1.5 times or more the second adhesive force. The first adhesive force may be, for example, 3.0 times or less the second adhesive force.

Specific examples of the expandable tape in which the first adhesive force is larger than the second adhesive force include a dicing expandable film HAE-1720 (trade name, manufactured by Showa Denko Materials Co., Ltd.).

Preparation Step

Figure 2:
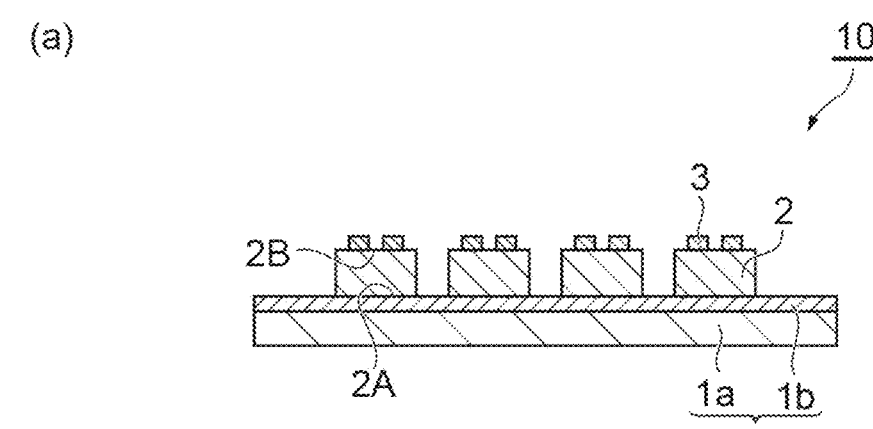
FIG. 2 is a schematic cross-sectional view for explaining an embodiment of a method for producing a semiconductor device, and each of FIGS. 2(*a*), 2(*b*), and 2(*c*) is a view illustrating each step.
Figure 2:
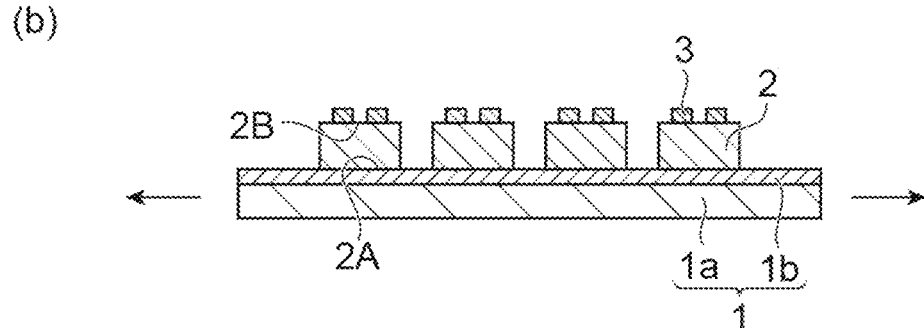
Figure 2:
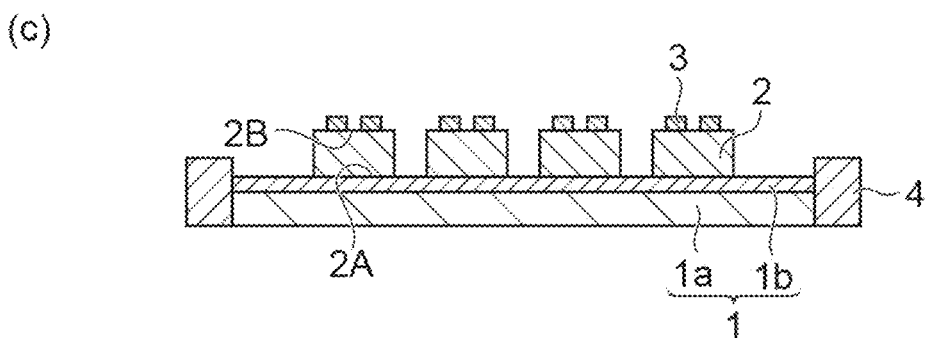

In a preparation step, a laminate 10 including an expandable tape 1 and a plurality of semiconductor chips 2 having first main surfaces 2A and second main surfaces 2B opposite to the first main surfaces 2A, in which the plurality of semiconductor chips 2 being fixed on the pressure-sensitive adhesive layer 1b of the expandable tape 1 with the first main surfaces 2A is prepared. In addition, the semiconductor chips 2 may have circuit surfaces on which pads (circuits) 3 are provided. Although FIG. 2 illustrates an aspect in which the first main surfaces 2A on the side opposite to the circuit surfaces of the semiconductor chips 2 are fixed to the expandable tape 1 (FIG. 2(a)), the laminate 10 may have an aspect in which the circuit surfaces on the second main surfaces 2B side of the semiconductor chips 2 are fixed to the expandable tape 1.

The laminate 10 can be fabricated, for example, by laminating a semiconductor wafer on a dicing tape or the like, then dicing with a blade or a laser to fabricate a plurality of singulated semiconductor chips, and transferring the semiconductor chips to the expandable tape 1.

The dicing may be blade dicing or stealth dicing in which a frangible layer is formed with a laser and expanded. In addition, from the viewpoint of improving productivity, the laminate 10 may be fabricated by directly laminating the semiconductor wafer on the expandable tape 1 and dicing the semiconductor wafer by the above-described method without the above-described transfer process.

From the viewpoint of productivity improvement and cost reduction, initial intervals between the semiconductor chips 2 (intervals between the semiconductor chips before the tape expanding step) are preferably narrow, and may be, for example, 100 μm or less, 80 μm or less, or 60 μm or less. In the cutting of the semiconductor wafer by dicing, when the initial intervals between the semiconductor chips 2 are wide, waste occurs in the semiconductor wafer, and thus, it is preferable that the intervals are narrow from the viewpoint of cost reduction. From the viewpoint of avoiding stress on the semiconductor chips 2 when expanding the intervals between the semiconductor chips 2, the initial intervals between the semiconductor chips 2 may be 10 μm or more. When the initial intervals between the semiconductor chips 2 is less than 10 μm, there is a tendency that expandable tape regions between the plurality of semiconductor chips 2 are small and it is difficult to expand.

A size of the semiconductor chip 2 is not particularly limited, but may be, for example, 25 mm$^2$ (5 mm×5 mm) or less, or 9 mm$^2$ (3 mm×3 mm) or less.

A type of the pads 3 on the circuit surfaces of the semiconductor chips 2 is not particularly limited as long as it can be formed on the circuit surfaces of the semiconductor chips 2, and may be a bump (projecting electrode) such as a copper bump or a solder bump or a relatively flat metal pad such as a Ni/Au plated pad.

The semiconductor chip 2 may include a resin portion for protection from an outside, an external terminal for electrically connecting a semiconductor element, and the like.

In the present specification, the term semiconductor chip includes a semiconductor package including a resin portion for protection from the outside, an external terminal for electrically connecting a semiconductor element, and the like. When the semiconductor package is used in the preparation step, for example, a semiconductor package fabricated at a substrate level is laminated on a dicing tape or the like, dicing is then performed with a blade or a laser to obtain a plurality of singulated semiconductor chips, and the semiconductor chips are then transferred to an expandable tape, whereby the laminate 10 can be fabricated.

Tape Expanding Step

In a tape expanding step, the expandable tape 1 is stretched while being heated to expand the intervals between the plurality of semiconductor chips 2 fixed on the expandable tape 1 (FIG. 2(*b*)).

Examples of the stretching method of the expandable tape 1 include a push-up method and a tensile method. In the push-up method, after the expandable tape 1 is fixed, a stage having a predetermined shape is raised to stretch the expandable tape 1. In the tensile method, after the expandable tape 1 is fixed, the expandable tape 1 is stretched by being pulled in a predetermined direction in parallel with a set expandable tape surface. The push-up method may be adopted from a viewpoint that the intervals between the semiconductor chips can be uniformly stretched and a viewpoint that a required (occupied) device area is small and compact.

The stretching conditions can be appropriately set according to a property of the expandable tape 1. For example, when the push-up method is adopted, a push-up amount (tensile amount) may be 10 to 150 mm or 10 to 120 mm. When the push-up amount is 10 mm or more, it is easy to expand the intervals between the plurality of semiconductor chips, and when the push-up amount is 150 mm or less, scattering or positional deviation of the semiconductor chips hardly occurs.

A heating temperature (temperature at the time of stretching) in the tape expanding step can be appropriately set according to the property of the expandable tape 1. A temperature at the time of stretching may be, for example, 25° C. to 200° C., 25° C. to 150° C., or 30° C. to 100° C. When the temperature at the time of stretching is 25° C. or higher, the expandable tape 1 is easily stretched, and when the temperature at the time of stretching is 200° C. or lower, the positional deviation of the semiconductor chips (peeling between the expandable tape and the semiconductor chips) due to distortion or slack due to thermal expansion or low elasticity of the expandable tape 1, scattering of the semiconductor chips, and the like can be more highly prevented. The heating temperature in the tape expanding step can be, for example, 50° C.

A push-up speed can also be appropriately set according to the property of the expandable tape 1. The push-up speed may be, for example, 0.1 to 500 mm/sec, 0.1 to 300 mm/sec, or 0.1 to 200 mm/sec. When the push-up speed is 0.1 mm/sec or more, productivity can be further improved. When the push-up speed is 500 mm/sec or less, peeling between the expandable tape and the semiconductor chips hardly occurs.

The intervals between the plurality of semiconductor chips 2 after the tape expanding step are arbitrarily expanded to intervals suitable for securing a necessary space for providing a rewiring pattern and a connection terminal pad outside the regions of the semiconductor chips 2. An expansion ratio in the tape expanding step may be, for example, more than 100% and less than 300% with respect to the intervals between the plurality of semiconductor chips 2 before the tape expanding step.

Tension Holding Step

In a tension holding step, the stretched expandable tape 1 is fixed using a fixing jig 4 to hold a tension of the expandable tape 1 (FIG. 2(*c*)). Accordingly, it is possible to prevent the stretched expandable tape 1 from returning to an original state.

A method for holding the tension of the expandable tape 1 is not particularly limited as long as the tension can be held and the intervals between the semiconductor chips can be prevented from returning to an original distance. For example, a method for fixing using a fixing jig such as a grip ring (manufactured by Technovision Co., Ltd.), a method for heating and contracting an outer peripheral portion of the expandable tape (heat shrink) to hold the tension, and the like can be exemplified.

Transfer Peeling Step

Figure 3:
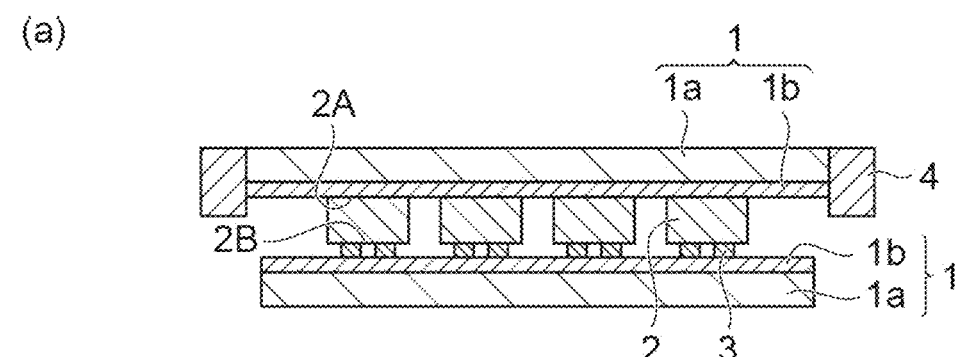
FIG. 3 is a schematic cross-sectional view for explaining the embodiment of the method for producing a semiconductor device, and each of FIGS. 3(*a*), 3(*b*), and 3(*c*) is a view illustrating each step.
Figure 3:
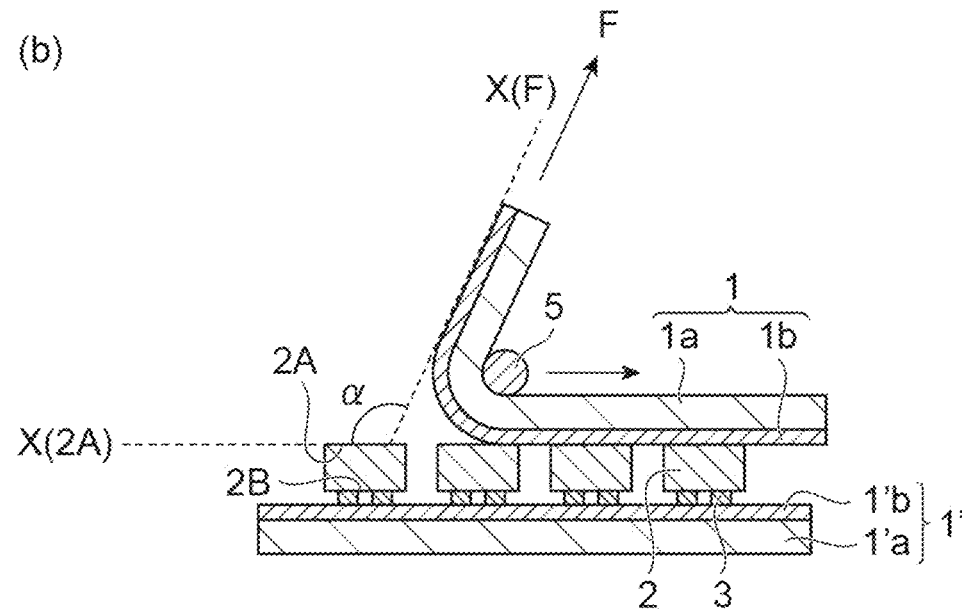
Figure 3:
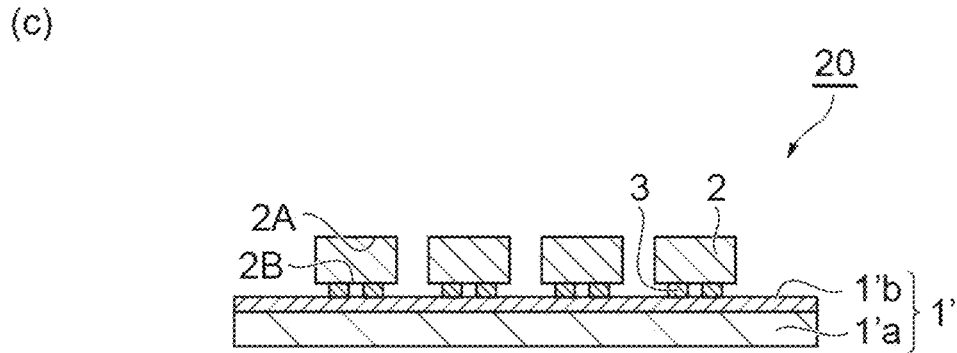

In a transfer peeling step, the plurality of semiconductor chips 2 are transferred onto a pressure-sensitive adhesive layer 1′*b* of another expandable tape 1′ (a base material film 1′*a* and a pressure-sensitive adhesive layer 1′*b*) of the same type as the expandable tape 1 so that the second main surfaces 2B (circuit surfaces of the semiconductor chips 2) of the plurality of semiconductor chips 2 are fixed (FIG. 3(*a*)), and the expandable tape 1 is peeled off at a peeling angle of more than 90° with respect to the first main surfaces 2A of the plurality of semiconductor chips 2 (FIG. 3(*b*)).

A transfer method (lamination method) is not particularly limited, but a roll laminator, a diaphragm type laminator, a vacuum roll laminator, or a vacuum diaphragm type laminator can be adopted.

Transfer conditions (lamination conditions) can be appropriately set according to the property of the expandable tape 1 and a property of the semiconductor chip 2. For example, when the roll laminator is used, a temperature condition may be, for example, 25° C. to 200° C., 25° C. to 150° C., or 25° C. to 100° C. When the temperature condition is 25° C. or higher, the semiconductor chips 2 are easily transferred to the expandable tape 1, and when the temperature condition is 200° C. or lower, the positional deviation of the semiconductor chips 2 due to distortion or slack (peeling between the expandable tape 1 and the semiconductor chips), scattering of the semiconductor chips 2, and the like due to thermal expansion, low elasticity, and the like of the expandable tape 1 can be more highly prevented. When the diaphragm type laminator is used, a temperature condition may be the same as that of the roll laminator described above. A compression time may be 5 to 300 seconds, 5 to 200 seconds, or 5 to 100 seconds. When the compression time is 5 seconds or more, the semiconductor chips 2 are easily transferred to the expandable tape 1, and when the compression time is 300 seconds or less, productivity can be improved. A pressure at the time of compression may be 0.1 to 3 MPa, 0.1 to 2 MPa, or 0.1 to 1 MPa. When the pressure at the time of compression is 0.1 MPa or more, the semiconductor chips 2 are easily transferred to the expandable tape 1, and when the pressure at the time of compression is 3 MPa or less, damage to the semiconductor chips 2 is reduced.

Subsequently, the expandable tape 1 is peeled off at a peeling angle exceeding 90° with respect to the first main surfaces 2A of the plurality of semiconductor chips 2. In the peeling of the expandable tape 1, for example, by pulling the expandable tape 1 in a tensile direction F via a peeling member 5, the expandable tape 1 can be peeled off from the first main surfaces 2A of the plurality of semiconductor chips 2. Here, the peeling angle is an angle α between the first main surfaces 2A (X(2A) in FIG. 2(*b*)) of the semiconductor chips 2 and the tensile direction F (X(F) in FIG. 2(*b*)). When the angle α exceeds 90°, an adhesive force between the expandable tape 1′ and the semiconductor chips 2 becomes larger than an adhesive force between the expandable tape 1 and the semiconductor chips 2, and the semiconductor chips 2 tend to be easily transferred to the expandable tape 1'. The angle α may be 100° or more, 110° or more, 120° or more, 130° or more, 140° or more, or 150° or more, and may be 180° or less or less than 180°.

A peeling rate at the time of peeling the expandable tape 1 may be, for example, 1 to 1000 mm/min. A peeling temperature at the time of peeling the expandable tape 1 can be arbitrarily set, and may be, for example, 25° C. to 200° C. When the expandable tape 1 is peeled off, the expandable tape 1' (the expandable tape as the transfer destination) is heated and the expandable tape 1 (the expandable tape as the transfer source) is not heated, so that the expandable tape 1 and the semiconductor chips 2 tend to be easily peeled off.

In this way, a laminate 20 including the expandable tape 1' and the plurality of semiconductor chips 2 fixed on the second main surfaces 2B (circuit surfaces of the semiconductor chips 2) on the pressure-sensitive adhesive layer 1'*b* of the expandable tape 1' can be obtained (FIG. 3(*c*)).

The tape expanding step and the transfer peeling step are repeated one or more times in this order. According to the study of the present inventors, it has been found that the positional deviation of the semiconductor chips tends to be large when an attempt is made to widen to a large expansion ratio (for example, an expansion ratio of 300% or more per one time) at a time using the expandable tape. According to the method for producing a semiconductor device of the present disclosure in which the tape expanding step and the transfer step are repeated one or more times in this order, the intervals between the semiconductor chips can be expanded stepwise, and the positional deviation of the semiconductor chips can be sufficiently suppressed even when the intervals between the singulated semiconductor chips are expanded to a target range of, for example, 300% or more with respect to the initial intervals between the semiconductor chips.

Figure 4:
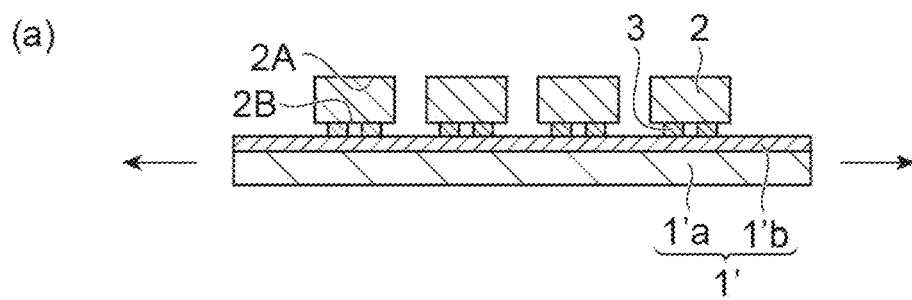
FIG. 4 is a schematic cross-sectional view for explaining the embodiment of the method for producing a semiconductor device, and each of FIGS. 4(*a*), 4(*b*), 4(*c*), and 4(*d*) is a view illustrating each step.
Figure 4:
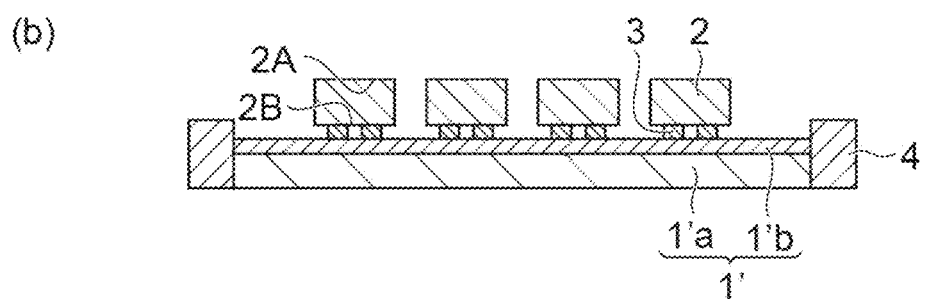
Figure 4:
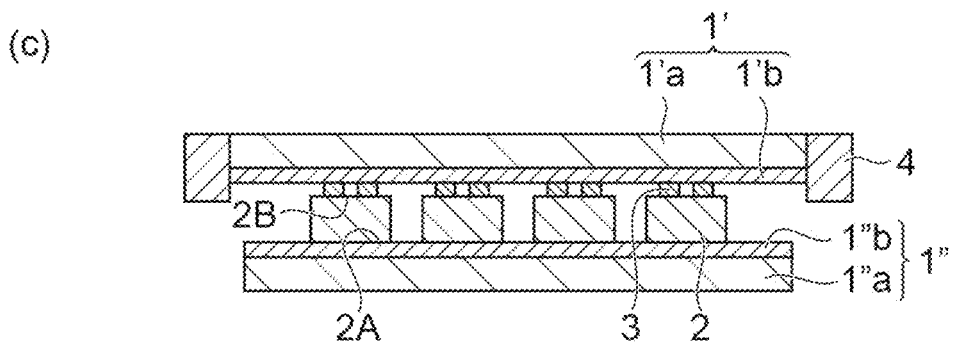
Figure 4:
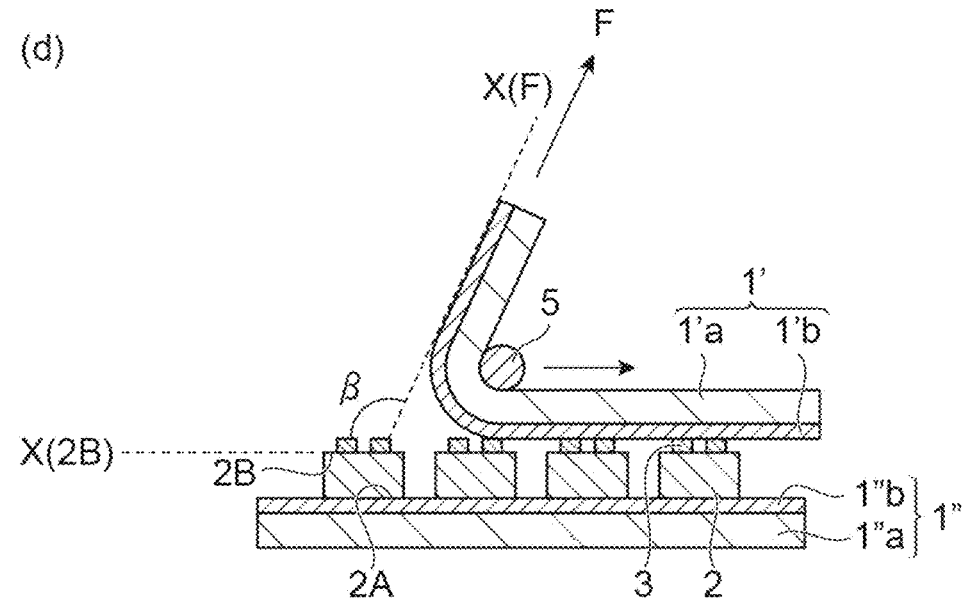

In the tape expanding step in a first repetition, the intervals between the plurality of semiconductor chips 2 fixed on the expandable tape 1' are expanded by stretching the expandable tape 1' while heating the expandable tape 1' (FIGS. 4(*a*) and 4(*b*)).

In the transfer peeling step in the first repetition, the plurality of semiconductor chips 2 are transferred onto a pressure-sensitive adhesive layer 1"*b* of another expandable tape 1" (a base material film 1"*a* and the pressure-sensitive adhesive layer 1"*b*) of the same type as the expandable tape 1' (FIG. 4(*c*)) so that the first main surfaces 2A of the plurality of semiconductor chips 2 are fixed, and the expandable tape 1' is peeled off at a peeling angle of more than 90° with respect to the second main surfaces 2B of the plurality of semiconductor chips 2 (FIG. 4(*d*)). Here, the peeling angle is an angle β between the second main surfaces 2B (X(2B) in FIG. 4(*d*)) of the semiconductor chips 2 and the tensile direction F (X(F) in FIG. 4(*d*)). A preferred aspect of the angle β may be the same as the preferred aspect of the angle α.

Figure 5:
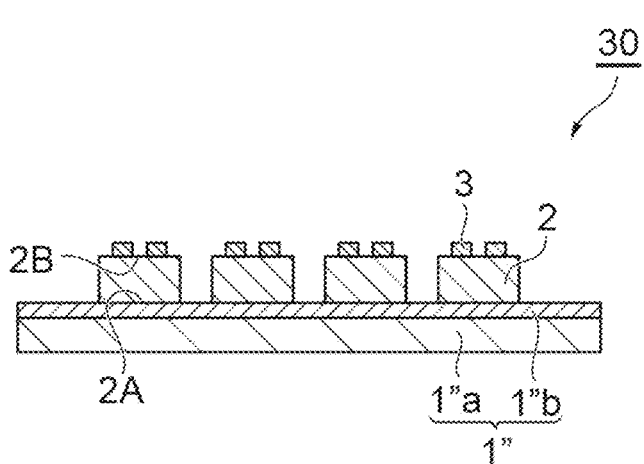
FIG. 5 is a schematic cross-sectional view for explaining the embodiment of the method for producing a semiconductor device, and each of FIGS. 5(*a*) and 5(*b*) is a view illustrating each step.
Figure 5:
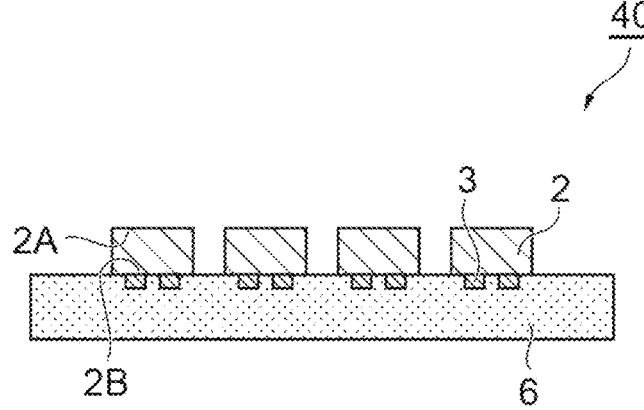

In this way, a laminate 30 including the expandable tape 1" and the plurality of semiconductor chips 2 fixed on the first main surfaces 2A on the pressure-sensitive adhesive layer 1"*b* of the expandable tape 1" may be obtained (FIG. 5(*a*)).

The repetition of the tape expanding step and the transfer peeling step is carried out with another expandable tape of the same type as the expandable tapes 1, 1', and 1" until finally transferred to the carrier. The repetition may be performed one time or more (the number of times of performing the tape expanding step is two or more in total), two times or more (the number of times of performing the tape expanding step is three or more in total), three times or more (the number of times of performing the tape expanding step is four or more in total), four times or more (the number of times of performing the tape expanding step is five or more in total), or five times or more (the number of times of performing the tape expanding step is six or more in total), or may be performed ten times or less (the number of times of performing the tape expanding step is 11 times or less in total).

Carrier Transfer Step

In a carrier transfer step, after the tape expanding step and the transfer peeling step are repeated one or more times in this order, the plurality of semiconductor chips 2 are transferred (laminated) from the expandable tape to the carrier 6. Finally, a semiconductor device 40 can be obtained by peeling the expandable tape from the semiconductor chips 2 (FIG. 5(*b*)).

The transfer method (lamination method) can be appropriately set according to the property of the expandable tape 1, the property of the semiconductor chip 2, and a property of the carrier 6. The lamination method and transfer conditions (lamination conditions) in the carrier transfer step may be the same as the lamination method and lamination conditions in the transfer peeling step.

The carrier 6 is not particularly limited as long as it can withstand the temperature and pressure at the time of transfer (the chips are not damaged, and the chip intervals are not changed) and can withstand the temperature and pressure at the time of sealing. For example, when a sealing temperature is 100° C. to 200° C., it is preferable to have heat resistance capable of withstanding the temperature range. A thermal expansion coefficient may be 100 ppm/° C. or less, 50 ppm/° C. or less, or 20 ppm/° C. or less. When the thermal expansion coefficient is large, defects such as positional deviation of the semiconductor chips tend to easily occur. In addition, when the thermal expansion coefficient is smaller than that of the semiconductor chip, distortion or warpage occurs, and thus the thermal expansion coefficient may be 3 ppm/° C. or more.

A material of the carrier 6 is not particularly limited, and examples thereof include silicon (wafer), glass, a plate of SUS, iron, Cu, or the like, a glass epoxy substrate, and the like.

A thickness of the carrier 6 may be 100 to 5000 μm, and is 100 to 4000 μm or 100 to 3000 μm. When the thickness of the carrier is 100 μm or more, handleability tends to be improved. When the thickness of the carrier is 5000 μm or less, it is economically advantageous.

The carrier 6 may include a plurality of layers. The carrier 6 may be provided with a tackifier layer or a temporary fixing material layer on which a temporary fixing material is laminated from a viewpoint of imparting adhesion force control in addition to a layer imparted with heat resistance and handleability. These layers can be arbitrarily provided in consideration of the adhesion force of the semiconductor chips or the expandable tape. In the case of including a plurality of layers, a thickness is not particularly limited, but may be, for example, 1 to 300 μm or 1 to 200 μm. When the thickness is 1 μm or more, a sufficient adhesive force with the semiconductor chips can be secured. On the other hand, when the thickness is 300 μm or less, it is economically advantageous.

According to the method for producing a semiconductor device of the present embodiment, when the tape expanding step and the transfer step are repeated one or more times, it is possible to sufficiently suppress a transfer failure at the time of transfer between the same expandable tapes. The reason why the transfer failure at the time of transfer between the same expandable tapes can be sufficiently suppressed by peeling the expandable tape as the transfer source at the predetermined angle using the predetermined expandable tape is not necessarily clear, but the present inventors infer that this is because the first adhesive force of the expandable tape is larger than the second adhesive force, and an adhesive force between the expandable tape as the transfer destination and the semiconductor chips becomes larger than an adhesive force between the expandable tape as the transfer source and the semiconductor chips by peeling the expandable tape as the transfer source at the predetermined angle, so that the semiconductor chips are easily transferred to the expandable tape as the transfer destination.

EXAMPLES

Hereinafter, the present disclosure will be described with reference to examples, but the present disclosure is not limited to these examples.

Preparation of Expandable Tape

As an expandable tape, a dicing expandable film HAE-1720 (trade name, manufactured by Showa Denko Materials Co., Ltd.) was prepared.

Measurement of First Adhesive Force (90° Peel Strength)

First, the expandable tape was cut out into a size of 25 mm in width×100 mm in length, and a surface on a side of a pressure-sensitive adhesive layer 1b was attached to a stainless plate (stainless support plate), and this was used as a measurement sample. Next, with the stainless plate (stainless support plate) side of the measurement sample fixed, the pressure-sensitive adhesive layer 1b was peeled off using a tensile tester (autograph AGS-1000, manufactured by Shimadzu Corporation) under conditions of a measurement temperature of 25° C., a peeling angle of 90°, and a peeling rate of 300 mm/min to measure a 90° peel strength. The 90° peel strength was 1.6 N/25 mm.

Measurement of Second Adhesive Force (180° Peel Strength)

A 180° peel strength was measured in the same manner as in the measurement of the 90° peel strength except that the peeling angle of 90° was changed to the peeling angle of 180°. The 180° peel strength was 0.8 N/25 mm.

REFERENCE SIGNS LIST 1, 1', 1": expandable tape, 1a, 1'a, 1"a: base material film, 1b, 1'b, 1"b: pressure-sensitive adhesive layer, 2: semiconductor chip, 2A: first main surface, 2B: second main surface, 3: pad (circuit), 4: fixing jig, 5: peeling member, 6: carrier, 10, 20, 30: laminate, 40: semiconductor device

The invention claimed is:

1. A method for producing a semiconductor device having a semiconductor chip, the method comprising:
a selection step of selecting an expandable tape comprising a base material film and a pressure-sensitive adhesive layer comprising a non-ultraviolet curable pressure-sensitive adhesive provided on the base material film, wherein a first adhesive force of the pressure-sensitive adhesive layer to a stainless plate measured under conditions of a peeling angle of 90° and a peeling rate of 300 mm/min at 25° C. is larger than a second adhesive force of the pressure-sensitive adhesive layer to the stainless plate measured under conditions of a peeling angle of 180° and a peeling rate of 300 mm/min at 25° C.;
a preparation step of preparing a laminate comprising the expandable tape and a plurality of the semiconductor chips having first main surfaces and second main surfaces opposite to the first main surfaces, wherein the plurality of semiconductor chips being fixed on the pressure-sensitive adhesive layer of the expandable tape on the first main surfaces;
a tape expanding step of expanding intervals between the plurality of semiconductor chips fixed on the expandable tape by stretching the expandable tape while heating the expandable tape; and
a transfer peeling step of transferring the plurality of semiconductor chips onto a pressure-sensitive adhesive layer of another expandable tape of a same type as the expandable tape so that the second main surfaces of the plurality of semiconductor chips are fixed, and peeling the expandable tape at a peeling angle of more than 90° with respect to the first main surfaces of the plurality of semiconductor chips,
wherein the tape expanding step and the transfer peeling step are repeated one or more times in this order.

2. The method for producing a semiconductor device according to claim 1, wherein the first adhesive force is 1.2 N/25 mm or more.

3. An expandable tape comprising:
a base material film; and
a pressure-sensitive adhesive layer comprising a non-ultraviolet curable pressure-sensitive adhesive provided on the base material film,
wherein a first adhesive force of the pressure-sensitive adhesive layer to a stainless plate measured at conditions of a peeling angle of 90° and a peeling rate of 300 mm/min at 25° C. is larger than a second adhesive force of the pressure-sensitive adhesive layer to the stainless plate measured at conditions of a peeling angle of 180° and a peeling rate of 300 mm/min at 25° C.

4. The expandable tape according to claim 3, wherein the first adhesive force is 1.2 N/25 mm or more.

5. The method for producing a semiconductor device according to claim 1, wherein the second adhesive force is 1.0 N/25 mm or less.

6. The method for producing a semiconductor device according to claim 1, wherein a difference between the first adhesive force and the second adhesive force is 0.5 N/25 mm or more.

7. The method for producing a semiconductor device according to claim 1, wherein the first adhesive force is 1.5 times or more the second adhesive force.

8. The expandable tape according to claim 3, wherein the second adhesive force is 1.0 N/25 mm or less.

9. The expandable tape according to claim 3, wherein a difference between the first adhesive force and the second adhesive force is 0.5 N/25 mm or more.

10. The expandable tape according to claim 3, wherein the first adhesive force is 1.5 times or more the second adhesive force.

* * * * *